United States Patent
Ferreira et al.

(10) Patent No.: US 11,442,813 B2
(45) Date of Patent: Sep. 13, 2022

(54) MEMORY DEVICES INCLUDING EXECUTION TRACE BUFFERS

(71) Applicant: HEWLETT-PACKARD DEVELOPMENT COMPANY, L.P., Spring, TX (US)

(72) Inventors: Ronaldo Rod Ferreira, Porto Alegre (BR); Taciano Perez, Porto Alegre (BR)

(73) Assignee: Hewlett-Packard Development Company, L.P., Spring, TX (US)

( * ) Notice: Subject to any disclaimer, the term of this patent is extended or adjusted under 35 U.S.C. 154(b) by 179 days.

(21) Appl. No.: 16/606,765

(22) PCT Filed: Oct. 11, 2017

(86) PCT No.: PCT/US2017/056148
§ 371 (c)(1),
(2) Date: Oct. 20, 2019

(87) PCT Pub. No.: WO2019/074500
PCT Pub. Date: Apr. 18, 2019

(65) Prior Publication Data
US 2020/0233757 A1 Jul. 23, 2020

(51) Int. Cl.
*G06F 11/14* (2006.01)
*G06F 11/10* (2006.01)
(Continued)

(52) U.S. Cl.
CPC ........ *G06F 11/141* (2013.01); *G06F 11/1004* (2013.01); *G06F 11/1666* (2013.01);
(Continued)

(58) Field of Classification Search
CPC .... G06F 3/0614; G06F 3/0619; G06F 3/0659; G06F 3/0679; G06F 11/1004;
(Continued)

(56) References Cited

U.S. PATENT DOCUMENTS

| 5,909,334 | A | * | 6/1999 | Barr | G11B 20/1879 360/53 |
| 6,854,071 | B2 | * | 2/2005 | King | G06F 11/0727 369/53.35 |

(Continued)

OTHER PUBLICATIONS

Chang, Jeff., NVDIMM-N Cookbook: A Soup-to-Nuts Primary on Using NVDIMM-Ns to Improve Your Storage Performance, 2015, SNIA, Retrieved from Internet <https://www.snia.org/educational-library/nvdimm-cookbook-soup-nuts-primer-using-nvdimms-improve-your-storage-performance> (Year: 2015).*

(Continued)

*Primary Examiner* — Bryce P Bonzo
*Assistant Examiner* — Albert Li
(74) *Attorney, Agent, or Firm* — HP, Inc. Patent Dept.

(57) ABSTRACT

A memory device includes a non-volatile memory to store data, an execution trace buffer, and a media controller. The media controller receives data-modifying commands and adds the data-modifying commands to the execution trace buffer. The media controller executes the data-modifying commands to modify the data stored in the non-volatile memory and detects errors in the data stored in the non-volatile memory. The media controller repeats execution of data-modifying commands from the execution trace buffer in response to detecting an error.

15 Claims, 4 Drawing Sheets

(51) Int. Cl.
  *G06F 11/16* (2006.01)
  *G06F 11/20* (2006.01)
(52) U.S. Cl.
  CPC ...... *G06F 11/2017* (2013.01); *G06F 11/2056* (2013.01); *G06F 2201/805* (2013.01)
(58) Field of Classification Search
  CPC ............. G06F 11/1008; G06F 11/1048; G06F 11/106; G06F 11/1064; G06F 11/141; G06F 11/1443; G06F 11/1666; G06F 11/2017; G06F 11/2056; G06F 2201/805; G11C 29/52
  See application file for complete search history.

(56) References Cited

U.S. PATENT DOCUMENTS

| | | | |
|---|---|---|---|
| 7,587,625 B2 | 9/2009 | Alexander et al. | |
| 7,836,331 B1 | 11/2010 | Totolos | |
| 8,365,015 B1 | 1/2013 | Yu et al. | |
| 9,075,621 B2 | 7/2015 | Schon et al. | |
| 9,575,892 B2 | 2/2017 | Deming et al. | |
| 9,626,313 B2 | 4/2017 | Acharya | |
| 10,901,868 B1* | 1/2021 | Dennin, III | G06F 11/2094 |
| 2014/0359395 A1* | 12/2014 | Ellis | G06F 11/1016 |
| | | | 714/763 |
| 2016/0179714 A1 | 6/2016 | Archarya | |
| 2017/0052845 A1 | 2/2017 | Ware et al. | |
| 2017/0168892 A1* | 6/2017 | Roh | G06F 3/061 |
| 2018/0018221 A1* | 1/2018 | Magro | G06F 11/10 |
| 2018/0260136 A1* | 9/2018 | Huo | G06F 3/0659 |

OTHER PUBLICATIONS

Wang, N.J. et al., Restore: Symptom Based Soft Error Detection in Microprocessors, 2005, http://www.cs.binghamton.edu/%7Eoguz/war2005/papers/war_final1.pdf.

* cited by examiner

MEMORY DEVICES INCLUDING EXECUTION TRACE BUFFERS

BACKGROUND

Persistent memory is non-volatile memory that can be directly manipulated by a processor via load and store instructions and whose contents survive power cycles. Examples of non-volatile memory technologies include phase-change random access memory (PCRAM), spin-transfer torque magnetic random access memory (STT-MRAM), resistive random access memory (ReRAM), and memristor memory. Applications may exploit the ability to have direct access to persistent memory using memory mapping (also known as file mapping), resulting in leaner and faster applications.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Memory devices may be subject to faults from multiple sources leading to data corruption (e.g., soft errors). Persistent memory devices (e.g., non-volatile memory devices) may be even more negatively affected by soft errors than volatile memory devices, since persistent memory devices cannot be brought back to a consistent state by a system reboot or cycle refresh. There are many existing techniques for detecting and recovering from memory errors caused by such faults in dynamic random access memory (DRAM) technology. These techniques may also be applied to persistent memory technology.

Accordingly, disclosed herein is a non-volatile memory device, such as a non-volatile dual in-line memory module (NVDIMM), including a media controller that receives requests from a memory controller and performs the appropriate internal tasks to fulfill the requests. The memory device also includes an execution trace buffer containing the previously received and executed data-modifying commands. The execution trace buffer is used to recover from correctable memory errors detected by the media controller by replaying the data-modifying commands from the execution trace buffer corresponding to a detected error. The memory device may include two execution trace buffers for redundancy.

Figure 1:
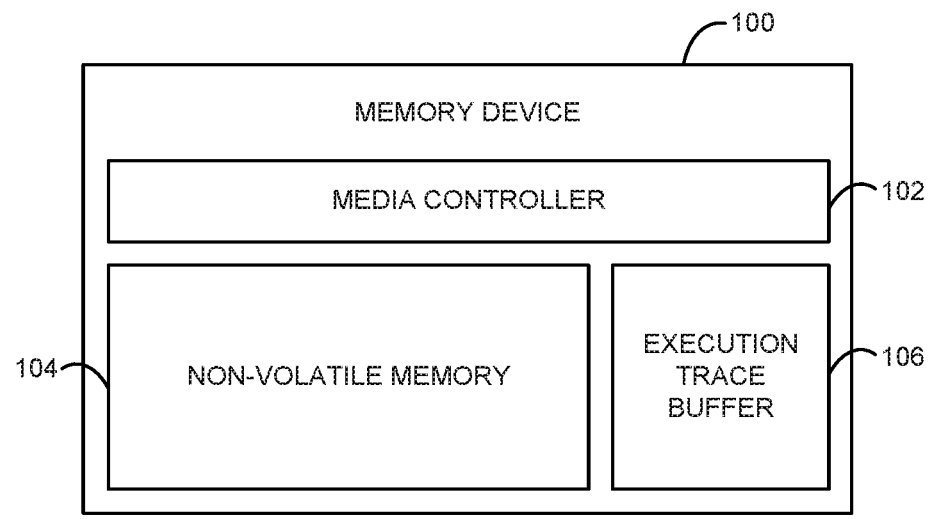
FIG. 1 is a block diagram illustrating one example of a memory device.

FIG. 1 is a block diagram illustrating one example of a memory device 100. Memory device 100 is a persistent memory device, such as a NVDIMM. Memory device 100 includes a media controller 102, a non-volatile memory 104, and an execution trace buffer 106. Non-volatile memory 104 stores data received from an external device (e.g., a processor). Non-volatile memory 104 may include a phase-change random access memory (PCRAM), a spin-transfer torque magnetic random access memory (STT-MRAM), a resistive random access memory (ReRAM), a memristor memory, or another suitable non-volatile memory.

Execution trace buffer 106 may be a persistent buffer (e.g., a circular log queue) containing the previously received and executed data-modifying commands as will be described below. Media controller 102 includes logic circuitry (e.g., a microcontroller) to receive and execute commands from a requesting device, such as load and store commands from a processor. In response to a load command, media controller 102 executes the load command to read the requested data from non-volatile memory 104 and return the requested data to the requesting device. In response to a store command, media controller 102 executes the store command to write the received data to non-volatile memory 104.

Memory device 100 implements three different functions including an operation phase, a detection phase, and a recovery phase. In the operation phase, media controller 100 receives data-modifying commands (e.g., store commands). Each data-modifying command may include a datum d and an address range r of non-volatile memory 104 where the datum is to be stored. In response to receiving a data-modifying command, media controller 102 adds the data-modifying command to execution trace buffer 106. In one example, media controller 102 adds the data-modifying command including the operands of the data-modifying command to the head of execution trace buffer 106.

If execution trace buffer 106 is full, media controller 102 may perform a self-check, which will be described below, to detect and correct potential errors. After the data is considered to be free of errors, media controller 102 may clear execution trace buffer 106. In other examples, execution trace buffer 106 may not be cleared and the oldest data-modifying command in execution trace buffer 106 may be replaced with the latest data-modifying command. Media controller 102 then executes the data-modifying command to modify the data stored in non-volatile memory 104. In one example, media controller 102 updates the in-place data at the specified address range r with the datum d for the data-modifying command. Media controller 102 may signal the success of each data-modifying command to the requesting device.

Media controller 102 detects errors in the data stored in non-volatile memory 104 by performing self-checks. A self-check may be performed after each execution of a data-modifying command or periodically after a predetermined number of data-modifying commands have been executed or after an elapsed time. A self-check may be performed synchronously with the command execution or asynchronously with the command execution. In one example, a self-check is performed after at most every N data-modifying commands, where N is the number of data-modifying commands that may be stored in execution trace buffer 106.

The self-checks detect soft errors (e.g., bit flips) in the data stored in non-volatile memory 104 in the detection phase of memory device 100. Any error detection method capable of detecting errors in specific data address ranges may be used. In one example, media controller 102 detects errors in the data stored in non-volatile memory 104 via at least one of cyclic redundancy checks, parity bits, checksums, or another suitable error detection process. Once a memory error is detected, the address range impacted by the error is diagnosed based on the detection process used. In response to detecting an error, media controller 102 enters the recovery phase as described below to recover the consistent state of the impacted memory address ranges.

In the recovery phase, media controller 102 repeats execution of data-modifying commands from execution trace buffer 106. Media controller 102 replays the execution from the state immediately before the error occurrence. In this way, the corrupted memory state is erased and the correct state is recomputed by the replayed instructions. In one example, in response to detecting an error, media controller 102 traverses execution trace buffer 106 and selects all commands targeted to the specified memory ranges where an error was detected. Media controller 102 then replays all the selected commands. The self-check may then be repeated to ensure the error has been corrected. If the error was not corrected, media controller 102 may repeat the recovery phase up to a predetermined number of times to attempt to correct the error. If none of the repeated attempts corrects the error, the error may be marked as uncorrectable and a failure notification for the memory command may be returned to the requesting device.

In this way, a low-latency recovery of soft errors in non-volatile memory 104 may be achieved while adding a low area overhead to memory device 100. Soft errors introduced in previous power cycles may be corrected. By placing execution trace buffer 106 in memory device 100, the consistency of the execution trace containing a track of operations that modify data with the corresponding data stored in memory device 100 is ensured. This feature may be useful in systems that may be audited for privacy and/or security concerns.

Figure 2:
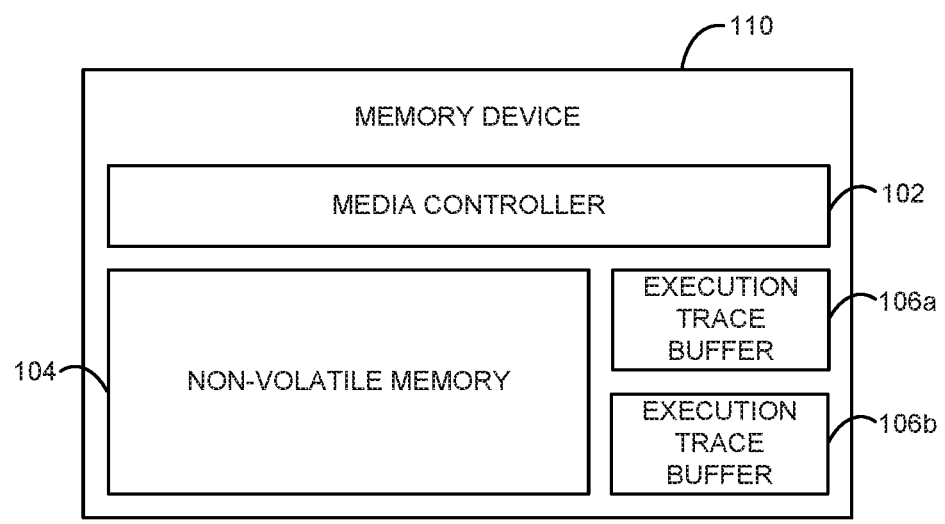
FIG. 2 is a block diagram illustrating another example of a memory device.

FIG. 2 is a block diagram illustrating another example of a memory device 110. Memory device 110 is similar to memory device 100 previously described and illustrated with reference to FIG. 1, except that memory device 110 includes a first execution trace buffer 106a and a second execution trace buffer 106b in addition to a media controller 102 and a non-volatile memory 104. In the operation phase of memory device 110, media controller 102 operates similarly to media controller 102 of memory device 110 except that each data-modifying command is added to both the first execution trace buffer 106a and the second execution trace buffer 106b. Accordingly, first execution trace buffer 106a stores a first copy of the execution trace, and second execution trace buffer 106b stores a second copy of the execution trace. In the detection phase of memory device 110, media controller 102 operates similarly to media controller 102 of memory device 100.

In the recovery phase, media controller 102 repeats execution of data-modifying commands from first execution trace buffer 106a or second execution trace buffer 106b. In one example, in response to detecting an error, media controller 102 traverses first execution trace buffer 106a or second execution trace buffer 106b and selects all commands targeted to the specified memory ranges where an error was detected. Media controller 102 then inspects the first copy of the execution trace in first execution trace buffer 106a to ensure the first copy does not contain soft errors. The error detection processes described above for the detection phase may be used to detect errors in the execution trace buffer. If no errors are detected in the first copy of the execution trace, media controller 102 replays all the selected commands from the first copy of the execution trace from first execution trace buffer 106a.

If errors are detected in the first copy of the execution trace, media controller 102 then inspects the second copy of the execution trace in second execution trace buffer 106b to ensure the second copy does not contain soft errors. If no errors are detected in the second copy of the execution trace, media controller 102 replays all the selected commands from the second copy of the execution trace from second execution trace buffer 106b. If errors are also detected in the second copy of the execution trace, media controller 102 checks if the first execution trace buffer 106a and the second execution trace buffer 106b include errors for different records (i.e., different data-modifying commands). If the errors are in different records, media controller 102 reconstructs a consistent copy of the execution trace from first execution trace buffer 106a and second execution trace buffer 106b and replays the selected commands from the consistent copy. If both the first copy and the second copy of the execution trace contain errors in the same records, the error within non-volatile memory 104 may be marked as uncorrectable and a failure notification for the memory command may be returned to the requesting device.

After replaying commands from the first copy of the execution trace from first execution trace buffer 106a, the second copy of the execution trace from second execution trace buffer 106b, or the consistent copy of the execution trace from first execution trace buffer 106a and second execution trace buffer 106b, the self-check may be repeated to ensure the error has been corrected. If the error was not corrected, media controller 102 may repeat the recovery phase up to a predetermined number of times to attempt to correct the error. If none of the repeated attempts corrects the error, the error may be marked as uncorrectable and a failure notification for the memory command may be returned to the requesting device.

Figure 3:
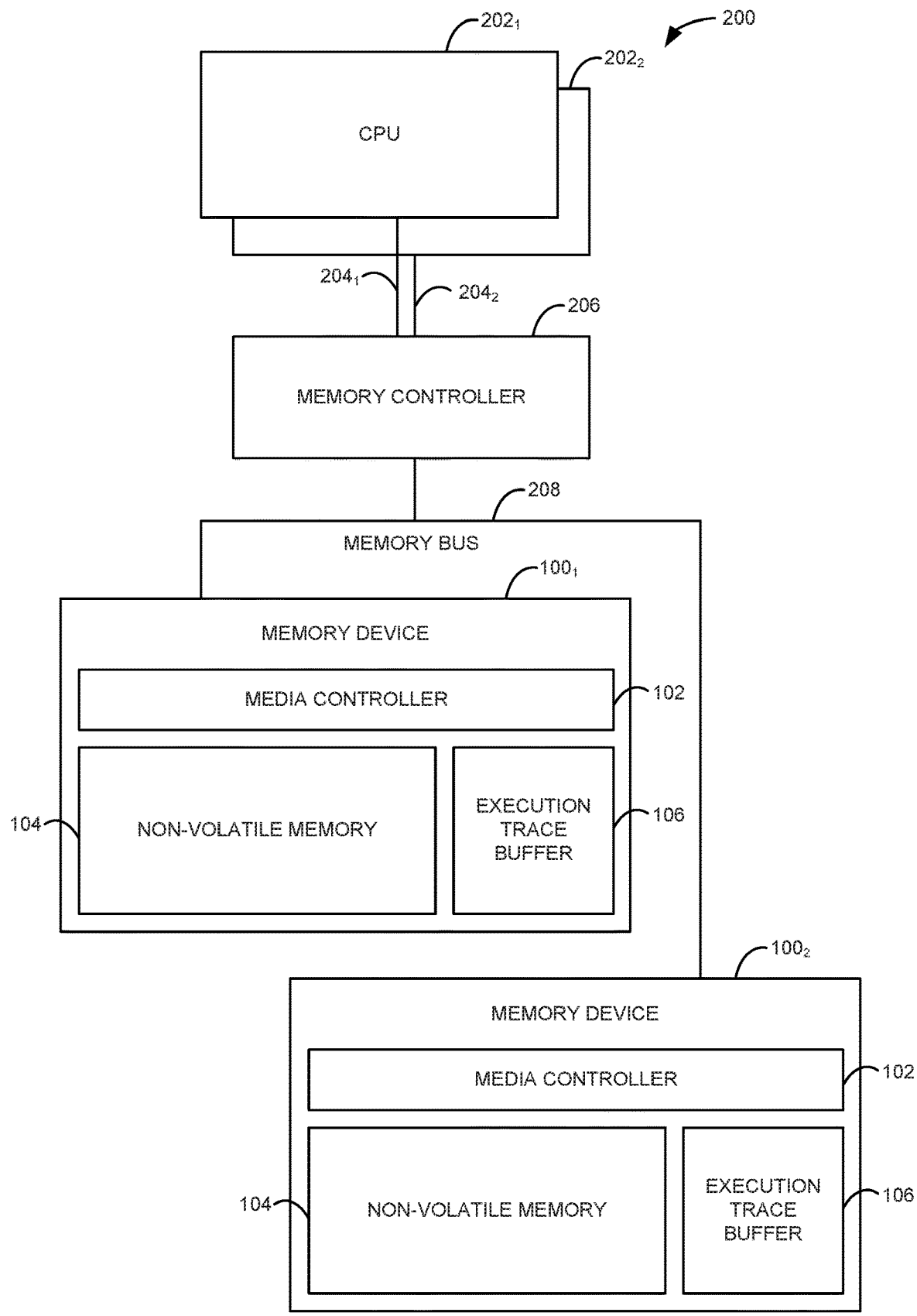
FIG. 3 is a block diagram illustrating one example of a system including the memory device of FIG. 1.

FIG. 3 is a block diagram illustrating one example of a system 200. System 200 includes central processing units (CPUs) 202$_1$ and 202$_2$, a memory controller 206, and memory devices 100$_1$ and 100$_2$. While system 200 illustrated in FIG. 3 includes two CPUs 202$_1$ and 202$_2$ and two memory devices 100$_1$ and 100$_2$, in other examples system 200 may include any suitable number of CPUs and memory devices. Each CPU 202$_1$ and 202$_2$ is communicatively coupled to memory controller 206 through a signal path 204$_1$ and 204$_2$, respectively. Memory controller 206 is communicatively coupled to each memory device 100$_1$ and 100$_2$ through a memory bus 208. In one example, each memory device 100$_1$ and 100$_2$ includes a memory device 100 as previously described and illustrated with reference to FIG. 1. In one example, each memory device 100$_1$ and 100$_2$ is a persistent memory module, such as a NVDIMM.

Each CPU 202$_1$ and 202$_2$ may issue commands, such as load and store commands, to memory controller 206. Memory controller 206 receives the commands from CPUs 202$_1$ and 202$_2$ and issues corresponding commands over memory bus 208 to the appropriate memory devices 100$_1$ and 100$_2$. In response to receiving a data-modifying command, each memory device 100$_1$ and 100$_2$ performs the processes previously described with reference to FIG. 1 for adding the data-modifying commands to the corresponding execution trace buffer 106, storing data in the corresponding non-volatile memory 104, checking for errors within the data stored in the corresponding non-volatile memory 104, and correcting detected errors by repeating execution of data-modifying commands from the corresponding execution trace buffer 106.

Figure 4:
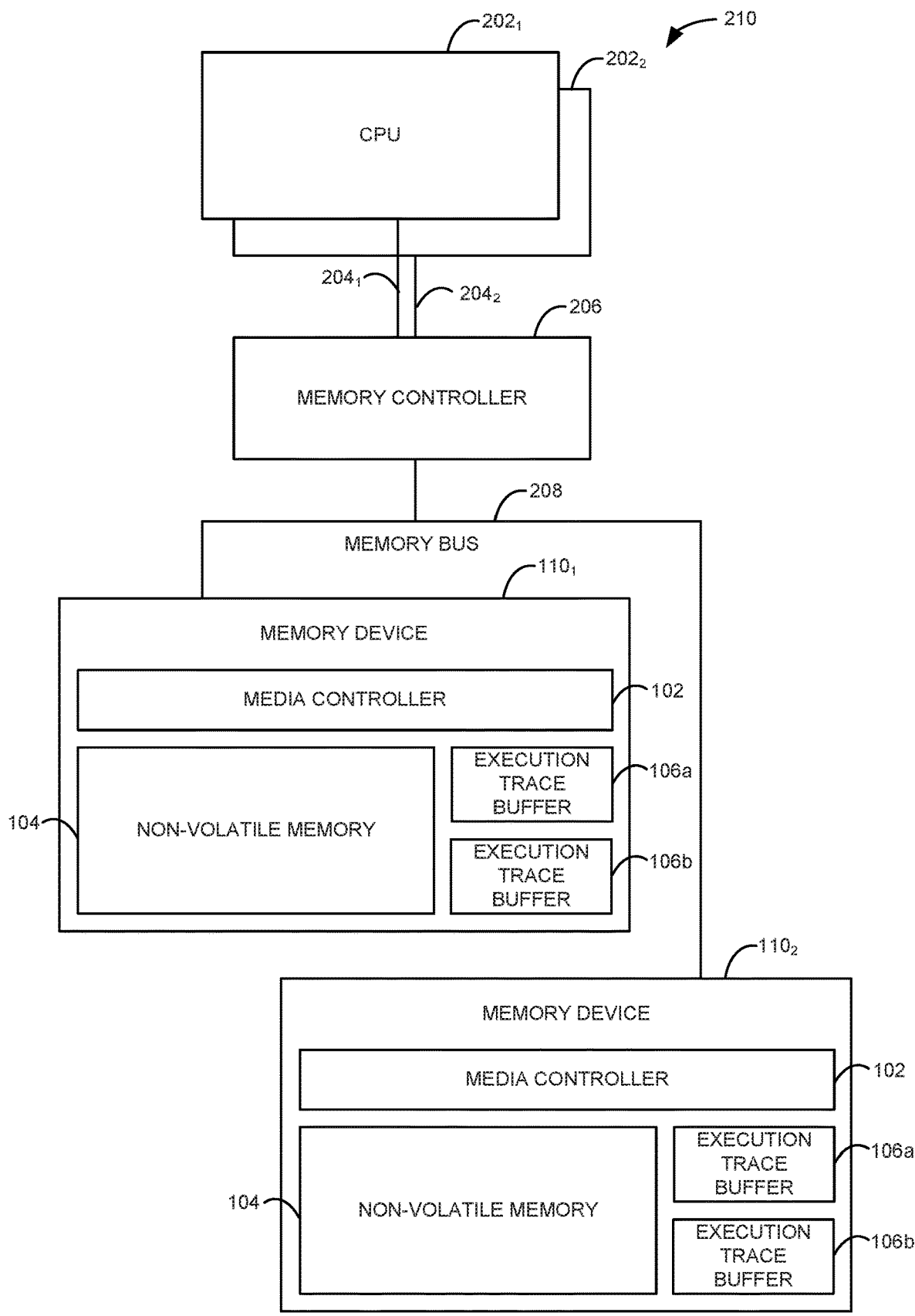
FIG. 4 is a block diagram illustrating one example of a system including the memory device of FIG. 2.

FIG. 4 is a block diagram illustrating another example of a system 210. System 210 includes central processing units (CPUs) $202_1$ and $202_2$ and a memory controller 206 as previously described and illustrated with reference to FIG. 3. In addition, system 210 includes memory devices $110_1$ and $110_2$. While system 210 illustrated in FIG. 4 includes two CPUs $202_1$ and $202_2$ and two memory devices $110_1$ and $110_2$, in other examples system 210 may include any suitable number of CPUs and memory devices. Each CPU $202_1$ and $202_2$ is communicatively coupled to memory controller 206 through a signal path $204_1$ and $204_2$, respectively. Memory controller 206 is communicatively coupled to each memory device $110_1$ and $110_2$ through a memory bus 208. In one example, each memory device $110_1$ and $110_2$ includes a memory device 110 as previously described and illustrated with reference to FIG. 2. In one example, each memory device $110_1$ and $110_2$ is a persistent memory module, such as a NVDIMM.

Each CPU $202_1$ and $202_2$ may issue commands, such as load and store commands, to memory controller 206. Memory controller 206 receives the commands from CPUs $202_1$ and $202_2$ and issues corresponding commands over memory bus 208 to the appropriate memory devices $110_1$ and $110_2$. In response to receiving a data-modifying command, each memory device $110_1$ and $110_2$ performs the processes previously described with reference to FIG. 2 for adding the data-modifying commands to the corresponding execution trace buffers 106a and 106b, storing data in the corresponding non-volatile memory 104, checking for errors within the data stored in the corresponding non-volatile memory 104, and correcting detected errors by repeating execution of data-modifying commands from the corresponding execution trace buffers 106a and/or 106b.

Figure 5:
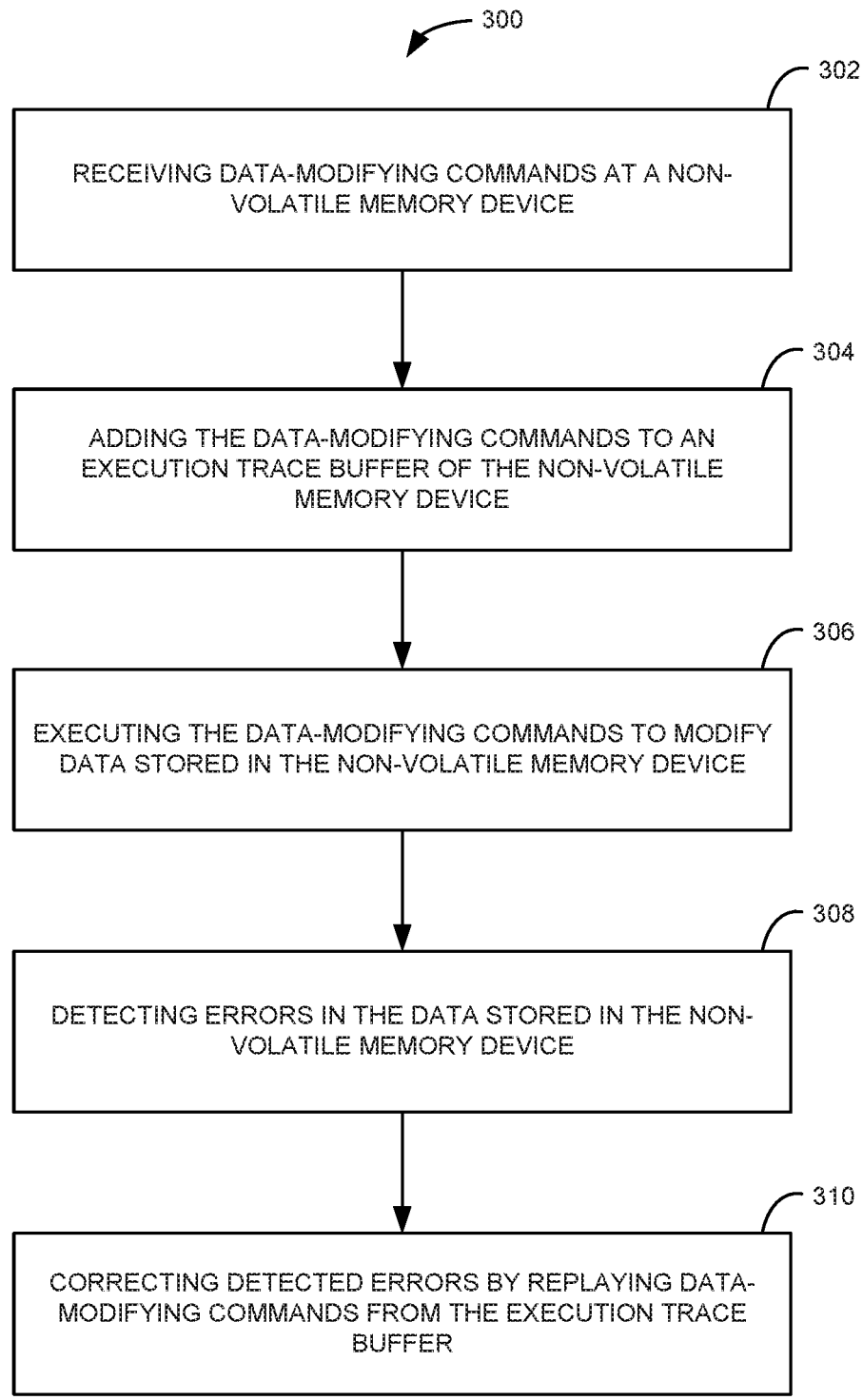
FIG. 5 is a flow diagram illustrating one example of a method for correcting errors in a non-volatile memory device.

FIG. 5 is a flow diagram illustrating one example of a method 300 for correcting errors in a non-volatile memory device. At 302, method 300 includes receiving data-modifying commands at a non-volatile memory device. At 304, method 300 includes adding the data-modifying commands to an execution trace buffer of the non-volatile memory device. At 306, method 300 includes executing the data-modifying commands to modify data stored in the non-volatile memory device.

At 308, method 300 includes detecting errors in the data stored in the non-volatile memory device. In one example, detecting errors includes performing a self-check after the execution of each data-modifying command. In another example, detecting errors includes performing a self-check after the execution of a predetermined number of data-modifying commands. At 310, method 300 includes correcting detected errors by replaying data-modifying commands from the execution trace buffer. In one example, correcting detected errors includes traversing the execution trace buffer and selecting all data-modifying commands corresponding to a detected error and replaying the selected data-modifying commands. Method 300 may also include returning a failure notification in response to detecting an uncorrectable error.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A memory device comprising:
   a non-volatile memory to store data;
   a first execution trace buffer;
   a second execution trace buffer; and
   a media controller to receive data-modifying commands, add the data-modifying commands to the first execution trace buffer and the second execution trace buffer, execute the data-modifying commands to modify the data stored in the non-volatile memory, detect errors in the data stored in the non-volatile memory, and repeat execution of data-modifying commands from the first execution trace buffer or the second execution trace buffer in response to detecting an error in the data stored in the non-volatile memory;
   wherein in response to detecting the error in the data stored in the non-volatile memory, the media controller inspects the first execution trace buffer for errors, and repeats execution of data-modifying commands from the first execution trace buffer in response to detecting no errors in the first execution trace buffer; and
   wherein the media controller inspects the second execution trace buffer for errors in response to detecting errors in the first execution trace buffer, and repeats execution of data-modifying commands from the second execution trace buffer hi response to detecting no errors in the second execution trace buffer.

2. The memory device of claim 1, wherein each data-modifying command comprises a datum and an address range of the non-volatile memory where the datum is to be stored, and
   wherein the media controller detects errors in the data stored in the non-volatile memory within a data address range and repeats execution of the data-modifying commands from the first execution trace buffer and the second execution trace buffer that correspond to the data address range in response to detecting the error in the data stored in the non-volatile memory.

3. The memory device of claim 1, wherein the media controller detects errors via at least one of cyclic redundancy checks, parity bits, and checksums.

4. The memory device of claim 1, wherein the first execution trace buffer or the second execution trace buffer comprises a circular log queue to persistently store the data-modifying commands.

5. The memory device of claim 1, wherein the memory device is a non-volatile dual in-line memory module (NVDIMM).

6. A memory device comprising:
   a non-volatile memory to store data;
   a first execution trace buffer;
   a second execution trace buffer; and
   a media controller to receive data-modifying commands, add the data-modifying commands to the first execution trace buffer and the second execution trace buffer, execute the data-modifying commands to modify the data stored in the non-volatile memory, detect errors in the data stored in the non-volatile memory, and repeat execution of data-modifying commands from the first execution trace buffer or the second execution trace buffer in response to detecting an error in the data stored in the non-volatile memory;
   wherein hi response to detecting the error hi the data stored hi the non-volatile memory, the media controller inspects the first execution trace buffer for errors, and repeats execution of data-modifying commands from the first execution trace buffer hi response to detecting no errors hi the first execution trace buffer; and wherein the media controller inspects the second execution trace buffer for errors in response to detecting errors in the first execution trace buffer, and repeats execution of data-modifying commands from the second execution trace buffer in response to detecting no errors in the second execution trace buffer.

7. The memory device of claim 6, wherein the media controller detects errors via at least one of cyclic redundancy checks, parity bits, and checksums.

8. The memory device of claim 7, wherein the first execution trace buffer or the second execution trace buffer comprises a circular log queue to persistently store the data-modifying commands.

9. The memory device of claim 6, wherein the media controller reconstructs a consistent copy of the data-modifying commands from the first execution trace buffer and the second execution trace buffer in response to detecting errors in the second execution trace buffer for data-modifying commands different from the data-modifying commands for which errors were detected in the first execution trace buffer, and repeats execution of data-modifying commands from the consistent copy.

10. The memory device of claim 6, wherein the media controller repeats execution of data-modifying commands from the first execution trace buffer or the second execution trace buffer a predetermined number of times in response to detecting the error in the data stored in the non-volatile memory has not been corrected by the repeated execution prior to marking the error as uncorrectabie.

11. A method comprising:
receiving data-modifying commands at a non-volatile memory device;
adding the data-modifying commands to a first execution trace buffer and a second execution trace buffer of the non-volatile memory device;
executing the data-modifying commands to modify data stored in the non-volatile memory device;
detecting errors in the data stored in the non-volatile memory device;
correcting detected errors by replaying data-modifying commands from the first execution trace buffer or the second execution trace buffer; and
wherein in response to detecting errors in the data stored in the non-volatile memory, a media controller inspects the first execution trace buffer for errors, and repeats execution of data-modifying commands from the first execution trace buffer in response to detecting no errors in the first execution trace buffer; and
wherein the media controller inspects the second execution trace buffer for errors in response to detecting errors in the first execution trace buffer, and repeats execution of data-modifying commands from the second execution trace buffer in response to detecting no errors in the second execution trace buffer.

12. The method of claim 11, wherein detecting errors in the data stored in the non-volatile memory comprises performing a self-check after the execution of each data-modifying command.

13. The method of claim 11, wherein detecting errors in the data stored in the non-volatile memory comprises performing a self-check after the execution of a predetermined number of data-modifying commands.

14. The method of claim 11, wherein correcting detected errors in the data stored in the non-volatile memory comprises traversing the first execution trace buffer and the second execution trace buffer and selecting all data-modifying commands corresponding to detected errors in the data stored in the non-volatile memory and replaying the selected data-modifying commands.

15. The method of claim 11, further comprising:
returning a failure notification in response to detecting an uncorrectable error.

* * * * *